(12) United States Patent
Tseng et al.

(10) Patent No.: US 7,459,386 B2
(45) Date of Patent: Dec. 2, 2008

(54) METHOD FOR FORMING SOLDER BUMPS OF INCREASED HEIGHT

(75) Inventors: Li-Hsin Tseng, Taichung (TW); Gil Huang, Hsinchu Jhubei (TW); Huei-Mei Yu, Hsinchu Hsien (TW); Chia-Jen Cheng, Taoyuan Hsien (TW); Ken Sun, Hsinchu (TW); Chien-Tung Yu, ChangHua Hsien (TW); Blenny Chang, Kaohsiung Hsien (TW); Chih Yang Chan, Taichung Hsien (TW); Jian-Wen Luo, Kaohsiung Hsien (TW); Owen Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 275 days.

(21) Appl. No.: 10/988,528

(22) Filed: Nov. 16, 2004

(65) Prior Publication Data

US 2006/0105560 A1 May 18, 2006

(51) Int. Cl.
*H01L 21/44* (2006.01)

(52) U.S. Cl. .................. 438/613; 257/E21.508

(58) Field of Classification Search .......... 438/613; 228/180.22; 257/E21.508
See application file for complete search history.

(56) References Cited

U.S. PATENT DOCUMENTS

| | | | |
|---|---|---|---|
| 4,391,511 A | 7/1983 | Akiyama et al. | |
| 5,773,897 A * | 6/1998 | Wen et al. | 257/778 |
| 5,874,199 A * | 2/1999 | Deligianni et al. | 430/312 |
| 6,372,622 B1 * | 4/2002 | Tan et al. | 438/612 |
| 6,486,054 B1 | 11/2002 | Fan et al. | |
| 6,555,296 B2 * | 4/2003 | Jao et al. | 430/312 |
| 6,596,618 B1 | 7/2003 | Narayanan et al. | |
| 6,602,775 B1 * | 8/2003 | Chen et al. | 438/612 |
| 6,649,507 B1 * | 11/2003 | Chen et al. | 438/614 |
| 6,673,711 B2 * | 1/2004 | Tong et al. | 438/613 |
| 6,723,630 B2 * | 4/2004 | Tong et al. | 438/613 |
| 6,813,000 B1 | 11/2004 | Nishi et al. | |

(Continued)

FOREIGN PATENT DOCUMENTS

JP    63-028035    2/1988

(Continued)

*Primary Examiner*—David A Zarneke
(74) *Attorney, Agent, or Firm*—Birch, Stewart, Kolasch & Birch, LLP

(57) ABSTRACT

A method for forming solder bumps (or solder balls after reflow) of improved height and reliability is provided. In one embodiment, a semiconductor substrate having at least one contact pad and an upper passivation layer having at least one opening formed therein exposing a portion of the contact pad is provided. A layer of under bump metal (UBM) is formed above the passivation layer and the contact pad. A first patterned and etched photoresist layer is provided above the UBM layer, the first patterned and etched photoresist layer defining at least one first opening therein. A second patterned and etched photoresist layer is provided above the first patterned and etched photoresist layer, the second patterned and etched photoresist layer defining at least one second opening therein, the second opening being wider than the first opening. A solder material is filled in the at least one first opening and substantially filled in the at least one second opening. The first and second photoresist layers are removed and the solder material is reflown to create a solder ball of increased height.

11 Claims, 4 Drawing Sheets

U.S. PATENT DOCUMENTS

| | | | |
|---|---|---|---|
| 6,861,346 B2 * | 3/2005 | Tong et al. | 438/613 |
| 6,878,633 B2 * | 4/2005 | Raskin et al. | 438/694 |
| 6,921,716 B2 * | 7/2005 | Huang et al. | 438/613 |
| 6,930,031 B2 * | 8/2005 | Huang | 438/612 |
| 7,189,646 B2 * | 3/2007 | Huang | 438/671 |
| 7,229,745 B2 * | 6/2007 | Lamarre | 430/313 |
| 7,262,505 B2 * | 8/2007 | Ahn et al. | 257/762 |
| 2006/0160027 A1 * | 7/2006 | Niwa et al. | 430/312 |

FOREIGN PATENT DOCUMENTS

| | | |
|---|---|---|
| JP | 63-260129 | 10/1988 |

\* cited by examiner

METHOD FOR FORMING SOLDER BUMPS OF INCREASED HEIGHT

BACKGROUND

The present invention relates generally to the formation of solder bumps on an integrated circuit device, and more particularly, to the formation of solder bumps having improved height and reliability.

Faster, reliable, and higher-density circuits at lower costs are the goals for integrated circuit (IC) packaging. Conventional wirebond technology, the most common method for electrically connecting aluminum bonding pads on a chip surface to the package inner lead terminals on the lead-frame or substrate has proven to be low cost and reliable. But for the future, packaging goals will be met by increasing the density of chips and reducing the number of internal interconnections. Packages with fewer interconnecting links lower potential failure points, reduce the circuit resistance, and reduce interconnect capacitance, which affects electrical performance. The need to reduce the IC package to fit end-user applications (e.g., smart cards, palmtop computers, camcorders, and so on) is driving the new packaging designs that reduce size and overall profile. This reduction is offset by the need for handling larger amounts of parallel data lines, therefore driving the need to increase package input/output requirements with more leads.

Advanced packaging designs are regularly introduced to solve packaging challenges. One such advanced package design is flip chip or chip scale package (CSP). Flip chip is a packaging method of mounting the active side of a chip (with the surface bonding pads) toward the substrate (i.e., upside down placement of the bumped die relative to the wirebonding approach—thus the reason for the term "flip" chip). It provides the shortest path from the chip devices to the substrate and low cost interconnection for high volume automated production. There is also a reduction in weight and profile since leadframes or plastic packages are often not used. Flip chip technology uses solder bumps—usually formed from tin/lead solder in a 5% Sn and 95% Pb ratio, for example to interconnect the chip bonding pads to the substrate. The solder bumps are generally positioned on the corresponding substrate contact pads and heat, often applied with hot air, and slight pressure then cause the solder bumps to reflow and form solder balls which form the electrical and physical connection between the substrate and the die. There are several methods known to those skilled in the art for producing solder balls on a semiconductor device including evaporation, electroplating, electroless plating, and screen printing.

In practicing the flip chip bonding technology, it has been found that the fatigue life of the solder ball joint is directly proportional to the height of the solder bumps (or solder balls after reflow). An increase in the height of the solder balls reduces the strain observed at the solder ball joints and consequently increases the fatigue life of solder ball joints established between the flip chip and a substrate.

In the evaporation, electroplating, and screen printing techniques for fabricating solder bumps, the final fabrication step is typically a reflow process for the solder bumps wherein a wafer is placed in a furnace, such as a nitrogen containing furnace, for heating the solder bumps to a reflow temperature which is normally the melting temperature of the solder material that forms the balls. The wafers are normally placed in the reflow furnace and typically placed facing up and thus, during the reflow or the melting of the solder bumps, even though the internal force in the bumps tend to draw the balls in a spherical shape, the internal force must balance with the gravity of the solder material and thus, a short or flattened spherical ball of the solder is normally formed. The short or flattened solder balls not only result in a shorter fatigue life, but also result in a small pitch between the balls. It is thus desirable to reduce the pitch of the solder ball arrays in order to accommodate higher level of circuit integration in IC devices that require greater interconnection densities. Further, when a wafer carrier or transport belt is slightly tilted, the flattened solder balls in a molten state may easily touch each other and cause a short circuit in the IC die.

Conventional methods of forming increased solder bump height include increasing the thickness of the photoresist layer so that taller solder material may be plated without the formation of a mushroom-shaped structure. But, this methodology has some challenges due to the limitation the photoresist thickness that can be achieved and the limitation of the exposure procedures. Current photo patterning procedures cannot handle photoresist layers if the photoresist layer is thicker than about 200 μm.

For these reasons and other reasons that will become apparent upon reading the following detailed description, there is a need for an improved method of forming solder balls having improved height and reliability that does not have the drawbacks or shortcomings of the conventional methods for forming solder balls. There is a further need for a method of forming solder balls that have improved height such that the pitch between the ball arrays may be increased.

SUMMARY

The present invention is directed to methods for forming solder bumps (or solder balls after reflow) of improved height and reliability. In one embodiment, a semiconductor substrate having at least one contact pad and an upper passivation layer having at least one opening formed therein exposing a portion of the contact pad is provided. A layer of under bump metal (UBM) is formed above the passivation layer and the contact pad. A first patterned and etched photoresist layer is provided above the UBM layer, the first patterned and etched photoresist layer defining at least one first opening therein. A second patterned and etched photoresist layer is provided above the first patterned and etched photoresist layer, the second patterned and etched photoresist layer defining at least one second opening therein, the second opening being wider than the first opening. A solder material is filled in the at least one first opening and substantially filled in the at least one second opening. The first and second photoresist layers are removed and the solder material is reflown to create a solder ball of increased height.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been shown in detail to avoid unnecessarily obscuring the present invention.

Reference will now be made in detail to the present preferred embodiments of the present invention, examples of which are illustrated in the accompanying drawings.

Figure 1:
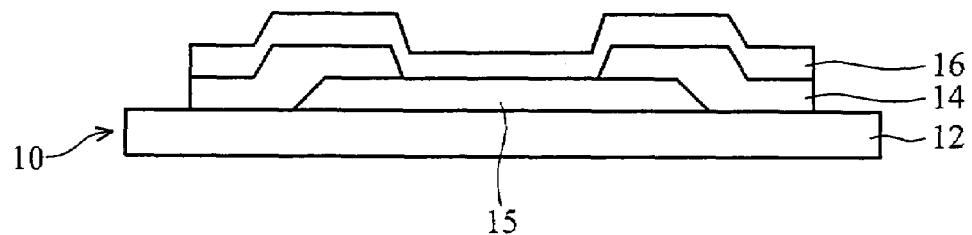
FIG. 1 is a cross-sectional view of a formation of a solder bump structure having a contact pad and an upper passivation layer having an opening formed therein exposing a portion of the contact pad and a UBM layer formed on the passivation layer according to one embodiment of the present invention.

FIGS. 1 through 7 illustrate cross-sectional views of a formation of a solder bump structure according to one embodiment of the present invention. As shown in FIG. 1, a semiconductor wafer 10 is provided having a base semiconductor substrate 12 and an upper passivation layer 14, which may be one or more layers, that extends partially over a bond pad or contact pad 15 located on the upper surface of the semiconductor wafer 10. Semiconductor substrate 12 is understood to include active and passive devices, conductive layers and dielectric layers and the type of the substrate is a design choice dependent on the fabrication process being employed. Upper passivation layer 14 has an opening therein exposing a portion of contact pad 15 and may be comprised of a material such as for example, silicon nitride (SiN), silicon dioxide (SiO2), and silicon oxynitride (SiON). Passivation layer 14 may be deposited by chemical vapor deposition (CVD) techniques. Contact pad 15 establishes electrical contact between the electrical interconnects in semiconductor substrate 12 and a later to be formed overlying solder bump. Contact pad 15 may be made from any of a variety of metals, including for example, aluminum, aluminum alloys, copper, and copper alloys.

Typically, an under bump metal (UBM) layer 16 is formed over the entire upper surface of semiconductor wafer 10 and over the upper surface of contact pad 15 to provide protection for the integrated circuits while making good mechanical and electrical contact with a to be formed solder bump. UBM layer 16 may be composed of a plurality of individual layers of a variety of different metals having a thickness of from about 0.5 microns to about 9 microns and may be deposited by any of a variety of methods such as evaporation or electroplating. In one embodiment, UBM layer 16 comprises a seed layer. In another embodiment, UBM layer 16 comprises an adhesion layer, a wetting layer formed above the adhesion layer, and a protection layer formed above the wetting layer. The adhesion layer functions to adhere to contact pad 15 and the surrounding passivation layer 14 while providing strong, low-stress mechanical and electrical connection. The wetting layer provides a wettable surface for the molten solder during the solder bumping process and provides good bonding of the solder to the underlying metal. Finally, the protection layer may be provided to add reliable protection to the underlying layers.

Figure 2:
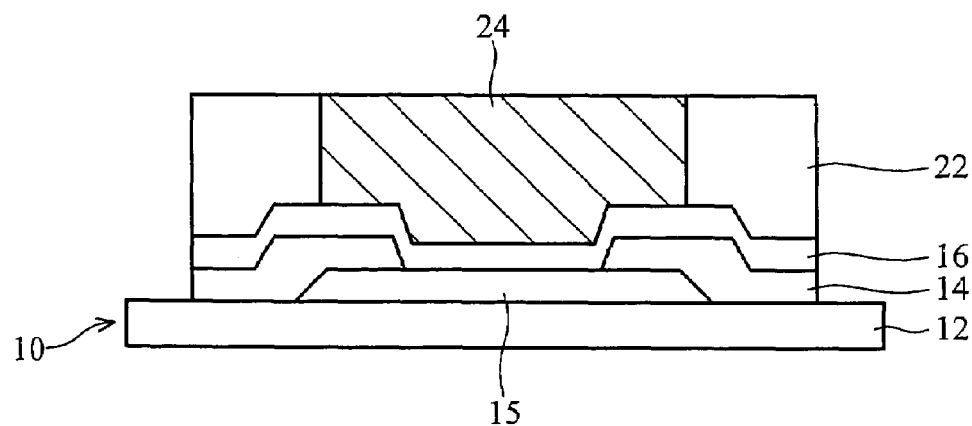
FIG. 2 is a cross-sectional view of the structure of FIG. 1 showing a first patterned photoresist layer formed on the UBM layer according to one embodiment of the present invention.

FIG. 2 shows a cross-sectional view of the structure of FIG. 1 showing a first photoresist layer 22 formed and then patterned on UBM layer 16 according to one embodiment of the present invention. First photoresist layer 22 may comprise of liquid photoresists which typically form mushroom shaped bumps or dry film resists (DFR) which form larger column shaped bumps. However, one skilled in the art will understand that any type of photoresist material may be used in the present invention without departing from the spirit and scope of the invention. First photoresist layer 22 may be applied on UBM layer 16 by conventional deposition processes such as spin coating to obtain a thickness of about 200 μm. In one embodiment, first photoresist layer 22 has a thickness of from about 50 μm to about 120 μm. Following deposition, first photoresist layer 22 thereafter undergoes a conventional patterning process. In one embodiment, first photoresist layer 22 is patterned with standard UBM sized opening to accommodate standard solder volume. As is understood by those skilled in the art, prior to patterning and developing steps, first photoresist layer 22 may optionally be cured or baked further hardening the surface of the layer of photoresist.

Figure 3:
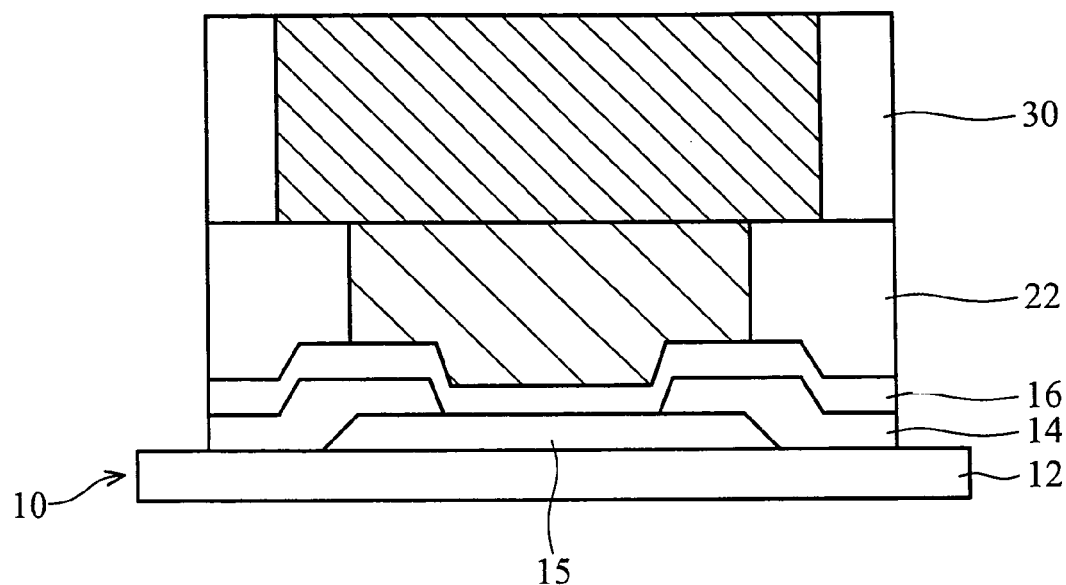
FIG. 3 is a cross-sectional view of the structure of FIG. 2 showing a second patterned photoresist layer formed on the first photoresist layer according to one embodiment of the present invention.

FIG. 3 shows a cross-sectional view of the structure of FIG. 2 showing a second photoresist layer 30 formed and then patterned on the first photoresist layer 22 according to one embodiment of the present invention. One purpose for the second photoresist layer 30 is to add additional photoresist height on top of the first patterned photoresist layer to accommodate more solder material to achieve higher solder bump height. Second photoresist layer 30 may comprise of any type of photoresist material and in one embodiment, second photoresist layer 30 comprises of liquid photoresists having a thickness of from about 50 μm to about 120 μm. In another embodiment, second photoresist layer 30 comprises of dry film resists having a thickness of from about 50 μm to about 120 μm. Second photoresist layer 30 may be applied on first photoresist layer 22 by a conventional deposition process such, as for example spin coating to obtain a thickness of about 200 μm. It is understood that the thickness of second photoresist layer 30 can be controlled and selected to be a desirable value, this especially in relation to the height of the column of a to be formed solder material. Thereafter, second photoresist layer 30 is patterned by conventional processes and is preferably patterned with wider opening than the standard UBM size opening of first photoresist layer 22 to contain more solder volume. Since the height of a solder bump is a function of the volume of solder structure, a wider opening in second photoresist layer 30 produces grand bump height.

Figure 4:
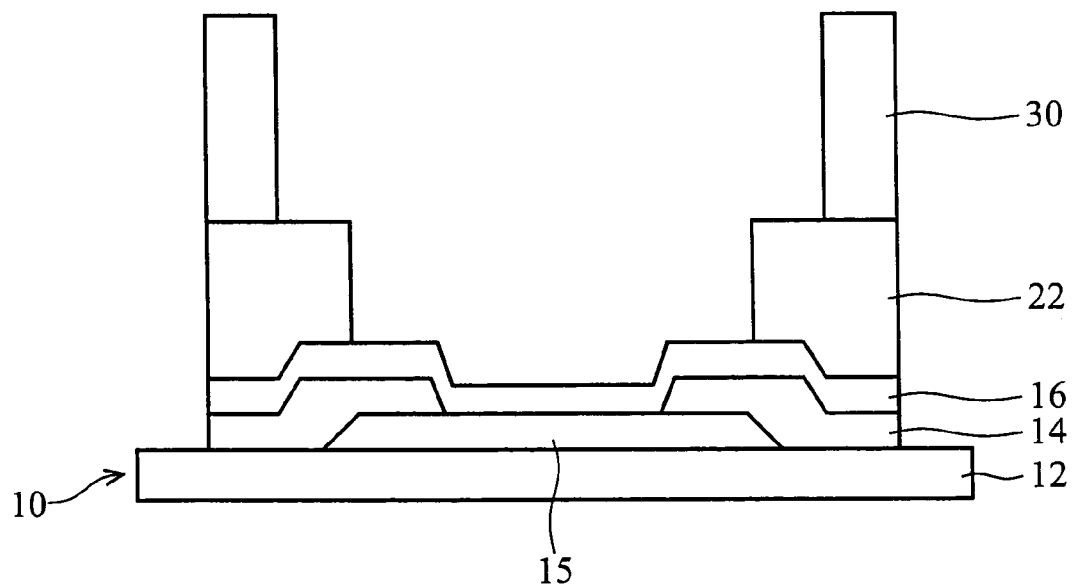
FIG. 4 is a cross-sectional view of the structure of FIG. 3 showing the development of the second photoresist layer to define a first opening therein and the development of the first photoresist layer to define a second opening therein, the first opening being wider than the second opening according to one embodiment of the present invention.

FIG. 4 is a cross-sectional view of the structure of FIG. 3 showing the development of the second photoresist layer 30 to define a first opening therein and the development of the first photoresist layer 22 to define a second opening therein according to one embodiment of the present invention. First and second openings overlay and align with the underlying contact pad 15 and in one embodiment, the first opening has a standard UBM size opening and in another embodiment, the second opening is wider than the first opening so that the second opening can contain more solder material to achieve higher solder bump height.

Figure 5:
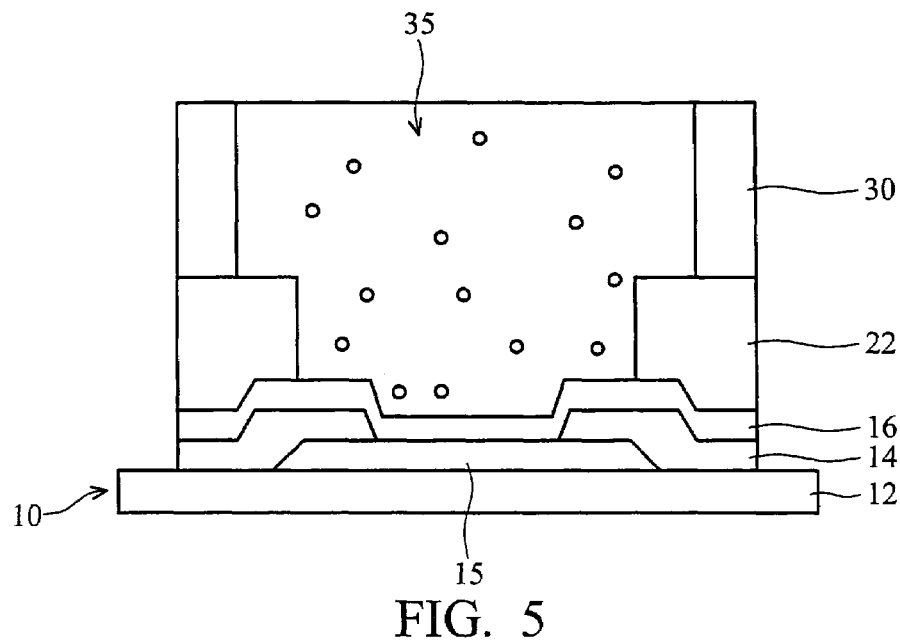
FIG. 5 is a cross-sectional view of the structure of FIG. 4 showing the filling of a solder material in the first and second openings according to one embodiment of the present invention.

FIG. 5 is a cross-sectional view of the structure of FIG. 4 showing the filling of a solder material 35 in the first and second openings according to one embodiment of the present invention. Following the deposition of UBM layer 16 and the development of first and second photoresist layers 22 and 30, respectively, an electrically conductive material may be deposited over UBM layer 16 by conventional evaporation, electroplating, electroless plating, and screen printing processes. The electrically conductive material may be any of a variety of metals, metal alloys or metals and mixtures of other materials, but preferably, the electrically conductive material is a solder 35. Solder 35 may be any of a variety of compositions and in one embodiment the solder 35 is in a 63 weight percent Sn, 37 weight percent Pb composition. Solder 35 may be deposited in first and second openings to a thickness of between about 125 μm to about 250 μm but more preferably to a thickness of about 225 μm. It is clear from the above and from the cross-section that is shown in FIG. 5, that the thickness of the first and second photoresist layers 22 and 30, respectively, can be controlled and selected to be a desirable value, this especially in relation to the height of solder material 35. This implies that the height of solder material 35 can be controlled from which follows that the diameter and height of the solder balls that is created by reflowing the solder material can be controlled.

Figure 6:
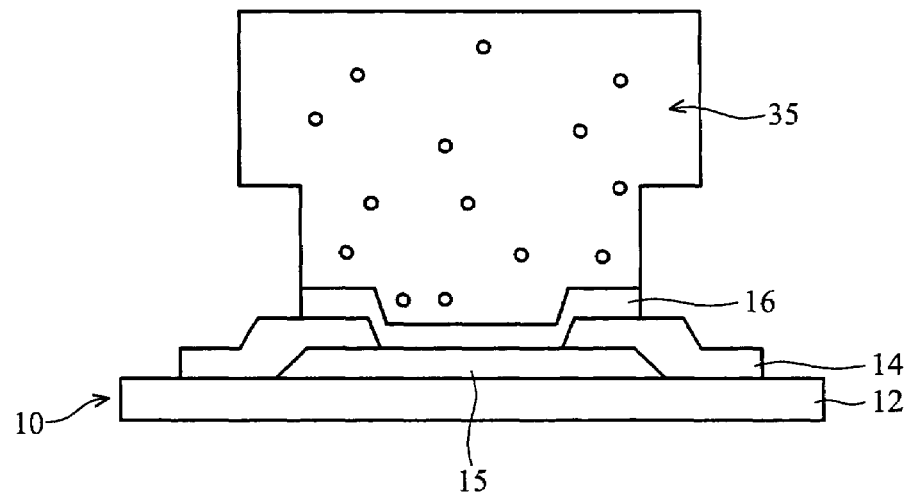
FIG. 6 is a cross-sectional view of the structure of FIG. 5 showing the removal of the first and second photoresist layers and the removal of a portion of the UBM layer according to one embodiment of the present invention.

FIG. 6 is a cross-sectional view of the structure of FIG. 5 after the developed first and second photoresist layers 22 and 30 have been stripped from the surface of the UBM layer 16 and the removal of a portion of the UBM layer 16 according to one embodiment of the present invention. First and second photoresist layers 22 and 30, respectively, may be removed by conventional etching processes, such as for example plasma etching and a portion of the UBM layer 16 may be removed by a wet etch process.

Figure 7:
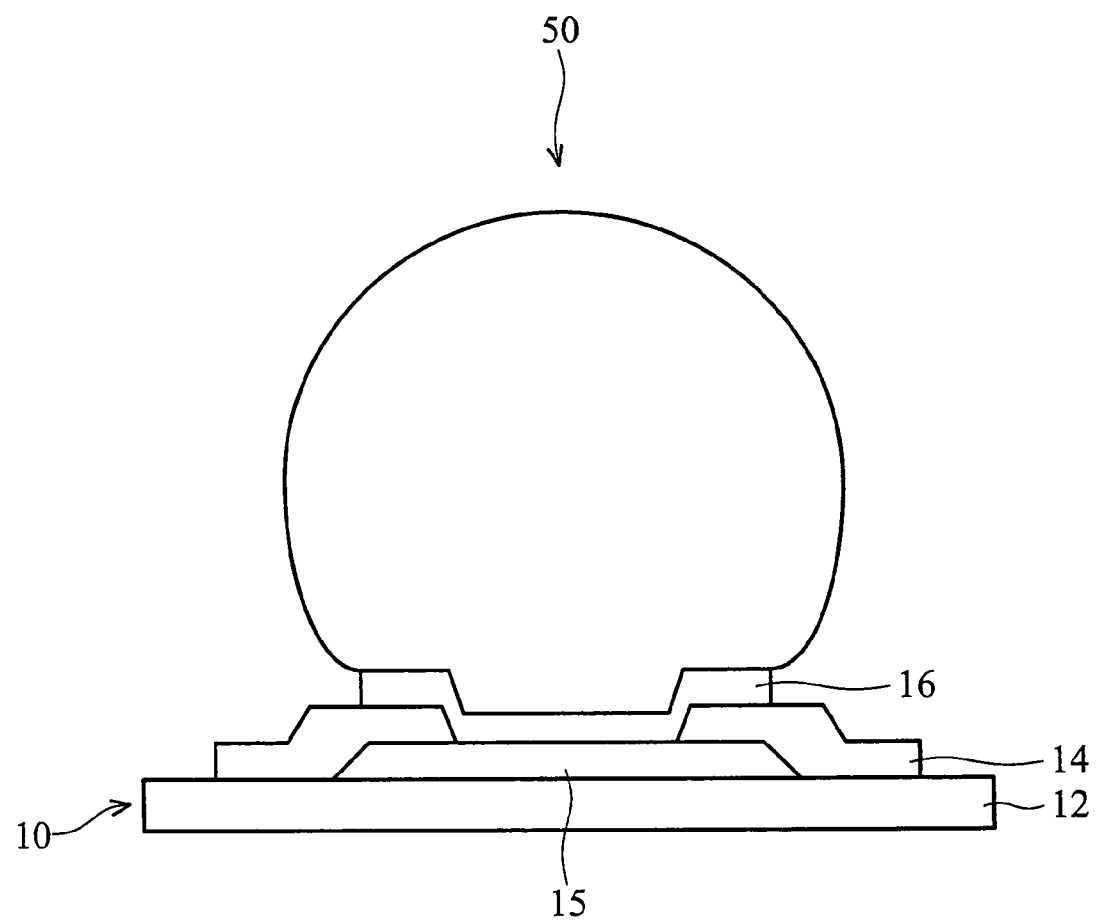
FIG. 7 is a cross-sectional view of the structure of FIG. 6 showing reflowing of the solder material to create a solder ball of increased height according to one embodiment of the present invention.

FIG. 7 is a cross-sectional view of the structure of FIG. 6 showing the reflowing of solder material 35 to create a solder ball 50 according to one embodiment of the present invention. Solder material 35 can be shaped into a solder ball 50 by exposing the structure to heat. For this processing step, a flux may be applied to solder material 35 and the solder is melted in a reflow surface under a nitrogen atmosphere, for example, forming the spherically shaped solder ball 50 of increased height. In one embodiment, solder ball 50 has a height of more than 200 μm.

It is clear from the invention that the thickness of the first and second photoresist layers can be selected such that the height of the solder ball can be selected. Moreover, as long as the photoresist process is well-controlled, forming photoresist layers having a thickness of 200 μm or beyond is possible. Consequently, a plurality of photoresist layers may be formed one on top of the other if the resist process is well-controlled to obtain higher and higher solder bump height. Further, the invention can easily produce grand bump height in column shape or mushroom shape, depending on the photoresist material being used.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming solder bumps of improved height, comprising:
   providing a semiconductor substrate having at least one contact pad and an upper passivation layer having at least one opening formed therein exposing a portion of the contact pad;
   forming a layer of Under Bump Metal (UBM) above the passivation layer and the contact pad;
   providing a first light sensitive layer above the UBM layer, wherein the first light sensitive layer has at least one first opening pattern region therein formed by a first exposure;
   providing a second light sensitive layer above the first light sensitive layer, wherein the second light sensitive layer has at least one second opening pattern region therein formed by a second exposure;
   developing the second and first light sensitive layers to remove the at least one first opening pattern region and the at least one second pattern region and respectively form at least one second opening and at least one first opening therein at the same time;
   filling a solder material in the at least one first opening and filling the solder material substantially in the at least one second opening;
   removing the first and second light sensitive layers; and
   reflowing the solder material to create a solder ball;
   wherein the step of providing the second light sensitive layer comprises:
      forming the second light sensitive layer above the first light sensitive layer after the first light sensitive layer is defined with the one first opening pattern region; and
      performing the second exposure to define on the second light sensitive layer the at least one second opening pattern region.

2. The method of claim 1, wherein forming the UBM layer comprises forming a plurality of conductive layers having a thickness of from about 0.5 microns to about 9 microns.

3. The method of claim 2, wherein forming the plurality of conductive layers comprises forming a seed layer.

4. The method of claim 2, wherein forming the plurality of conductive layers comprises:
   forming an adhesion layer;
   forming a wetting layer above the adhesion layer; and
   forming a protection layer above the wetting layer.

5. The method of claim 1, wherein the first light sensitive layer comprises a photoresist layer or a dry film resist layer having a thickness of from about 50 μm to about 120 μm.

6. The method of claim 1, wherein the second light sensitive layer comprises a photoresist layer or a dry film resist layer having a thickness of from about 50 μm to about 120 μm.

7. The method of claim 1, further comprising:
   removing a portion of the UBM layer by a wet etch process.

8. The method of claim 1, wherein the at least one first opening having a standard UBM size opening.

9. The method of claim 1, wherein the at least one second opening is wider than the at least one first opening such that the second opening contains more solder material than the first opening to achieve higher solder bump height.

10. The method of claim 1, wherein the solder material is filled in the first and second openings to a thickness of about 125 μm to about 250 μm.

11. The method of claim 1, wherein the solder ball has a height of more than 200 μm.

\* \* \* \* \*